United States Patent [19]

Lischke

[11] Patent Number: 4,628,258

[45] Date of Patent: Dec. 9, 1986

[54] METHOD AND APPARATUS FOR ELECTRICAL TESTING OF MICROWIRED STRUCTURES WITH THE ASSISTANCE OF PARTICLE PROBES

[75] Inventor: Burkhard Lischke, Munich, Fed. Rep. of Germany

[73] Assignee: Siemens Aktiengesellschaft, Berlin and Munich, Fed. Rep. of Germany

[21] Appl. No.: 735,525

[22] Filed: May 20, 1985

[30] Foreign Application Priority Data

Jun. 1, 1984 [DE] Fed. Rep. of Germany ....... 3420552

[51] Int. Cl.$^4$ ............... G01R 31/02; G01R 31/22; G06F 11/32
[52] U.S. Cl. ............... 324/158 P; 324/52; 324/73 PC; 250/310
[58] Field of Search ............ 324/71.3, 73 PC, 73 R, 324/51, 52, 158 P, 158 R; 250/310

[56] References Cited

U.S. PATENT DOCUMENTS

| | | | |
|---|---|---|---|
| 4,169,244 | 9/1979 | Plows | 324/73 PC |
| 4,277,679 | 7/1981 | Feuerbaum | 250/310 |
| 4,415,851 | 11/1983 | Langner et al. | 324/51 |
| 4,417,203 | 11/1983 | Pfeiffer et al. | 324/51 |
| 4,460,866 | 7/1984 | Feuerbaum | 324/73 PC |
| 4,471,302 | 9/1984 | Fazekas | 324/73 R |
| 4,573,008 | 2/1986 | Lischke | 324/158 R |

FOREIGN PATENT DOCUMENTS 2215179 10/1973 Fed. Rep. of Germany .

OTHER PUBLICATIONS

"Handbuch der Physik", vol. XXI, 1956, Springer-Verlag, Berlin-Göttingen-Heidelberg, pp. 254–256.

Primary Examiner—Reinhard J. Eisenzopf
Assistant Examiner—Jose M. Solis
Attorney, Agent, or Firm—Hill, Van Santen, Steadman & Simpson

[57] ABSTRACT

A method and an apparatus are provided for electrical testing of continuity in microwired structures in which at least one first circuit node is electrically charged with at least one first particle probe and at least one second circuit node is sensed with at least one second particle probe to determine whether it has an electrically conductive connection to at least one first circuit node. Such a method and such an apparatus should, with relatively simple structure, enable the charging at microwired structures to be measured in a tracking manner, a switching of the beam generator to various values of primary energy is avoided and all disadvantages connected with a secondary electron signal are suppressed. At least one second particle probe is deflected in the region of the electrical fields that extend from the at least one second circuit node. The potential at this second circuit node is qualitatively and quantitatively identified by way of the deflection of the second particle probe which thereby occurs.

14 Claims, 2 Drawing Figures

METHOD AND APPARATUS FOR ELECTRICAL TESTING OF MICROWIRED STRUCTURES WITH THE ASSISTANCE OF PARTICLE PROBES

BACKGROUND OF THE INVENTION

1. Field of the Invention

The present invention relates to a method and an apparatus for electrical testing of microwired structures with the assistance of particle probes in which a first circuit node is electrically charged with at least one first particle beam and the second circuit node is investigated with at least one second particle beam to determine whether the second node is electrically connected to the first node.

2. Description of the Prior Art

Needle adapters which encounter their technological limit given a test grid whose grid dimension amounts to less than 200 μm are presently employed for the electrical testing of printed circuitboards. Alternative testing methods are therefore being sought for testing miniaturized printed circuit-boards and for testing microwired structures.

The German published application No. 22 15 179, fully incorporated herein by this reference, discloses a method for electrical testing of printed circuitboards with the assistance of two electron probes. For example, for checking a resistance value, a first end of the resistor to be measured is charged to a first potential with the assistance of a first electron probe. The secondary electron emission coefficient at the point of incidence of the first electron probe must thereby be less than 1. The other end of the resistor to be measured is driven by a second electron probe. The secondary electron emission coefficient at the point of incidence of the second electron probe must be greater than 1. In the static condition, both the point of incidence of the first electron beam as well as the point of incidence of the second electron beam respectively have a defined potential. In the static condition, the current having a very specific current intensity also flows between these points of incidence of the two electron probes. Given this known method, a secondary electron current which likewise has a very specific current intensity is emitted at the point of incidence of the second electron probe in the static condition. Given this known method, the value resistance to be identified is determined in that the potentials of two points of incidence of the two electron probes and the current intensity of the second electron current emitted from the point of incidence of the second electron probe are identified.

A method that is the same as the method disclosed in the above-mentioned published German application is disclosed in U.S. Pat. No. 4,415,851, fully incorporated herein by this reference. A method that is similar to that of the German published application is disclosed in U.S. Pat. No. 4,417,203, also fully incorporated herein by this reference.

Given the known electron beam measuring methods for checking microwired structures, interconnect networks are electrically charged with at least one electron probe. When there is a conductive connection between circuit nodes that are electrically charged or, respectively, that have been electrically charged, and other circuit nodes, then electrical charge is also transported to the other points via this conductive connection. As a consequence, the potentials of these other points are also changed. The changed potentials of the other points can be measured in the known electron beam measuring methods via the secondary electrons that are emitted from these other points. The energy of the secondary electrons emitted from a test access point depends on the potential of the test access point (circuit node). Conductive connections can be discriminated from interrupted connections with such a method. A measure for the potential at a measuring point is the size of the secondary electron signal read at the measuring point. Measuring the potential at a measuring point via the secondary electron signal belonging to the measuring point is disclosed, for example, in U.S. Pat. No. 4,277,679, fully incorporated herein by this reference. The secondary electron signal depends not only on the potential of the measuring point, but also, in an undesired manner, on close fields in the environment of the measuring point, on the contamination in the environment of the measuring point and on the respective electron orbits which lead to the detector and which generally proceed differently for different energies of the secondary electron beams.

When different energies of the primary electrons are required for writing a potential at a circuit node and for reading the potential at a different circuit node, then the switching of the beam generator to different primary electrons is only possible with great technical expense. Finally, the interconnected networks have different capacitances and therefore require different times until specific circuit nodes are respectively charged to a specific voltage. When measuring an individual value of resistance given the aforementioned measuring methods, therefore, either a relatively long time must be provided for the charging event so that one can be certain that the measuring arrangement is in the static condition or an involved apparatus must be provided so that the charging event can also be tracked in a measuring fashion with one of the above measuring methods.

SUMMARY OF THE INVENTION

The object of the present invention is to provide a method and an apparatus of the type generally set forth above which, with relatively simple means, enable the charging at microwired structures to be tracked in a measuring fashion, which enable a switching of a beam generator to various primary energies to be avoided, and in which all disadvantages connected with a secondary electron signal are suppressed.

The above object is achieved according to a method and apparatus of the type generally set forth above in which at least one second particle probe is deflected in the region of the electrical fields that extend from the second circuit node under investigation, and in which the potential at the second circuit node is qualitatively or quantitatively determined by way of the deflection of the second particle probe, the deflection being measured by at least one detector dependent on the potential of the second circuit node.

The principle underlying the present invention is based on the proposition that respectively separate electron probes are employed for writing the potential information into a circuit node and for reading a potential information from the circuit node and that a measurement of the potential at a circuit node occurs via the deflection of an electron beam by the electric fields in the environment of the measured circuit mode. An apparatus for carrying out the invention can be calibrated by applying known voltages to the circuit nodes and by measuring the respectively resulting deflection angle with which the electron beam is deflected at the circuit node under test.

Although the present invention shall be explained below with respect to illustrated embodiments for electron probes, the invention is not limited to the use of electron probes. It is important only that a first circuit node is charged with a first particle probe, that a charge is to be transported from the first circuit node via a potentially-conductive connection to a second circuit node or, respectively, should have already been transported, that, as a consequence thereof, the second circuit node is electrically positively or negatively charged or, respectively, has been therefore charged or has not been changed in terms of its potential given a defective electrical line, and that a second particle probe is employed as a reading beam, whereby the charge of the particles has the same operational sign as the charge with which the second circuit node is provided or, respectively, has been provided or, respectively, should have been provided. When, therefore, the second circuit node is negatively charged or, respectively, has been negatively charged, then a particle probe having negatively-charged particles, for example an electron beam probe, is employed as the reading beam.

A first circuit node can be charged in the defined manner in and of itself with a writing beam. In such a case, a scanning particle beam will be employed. However, a group of first circuit nodes can likewise be electrically charged in a defined manner with a writing beam. A scanning particle beam can again be utilized for such a purpose; however, a flat beam can likewise be utilized. An arbitrary plurality of writing beams can be employed for testing complexly-constructed electrical connections between various measuring points and these beams can, in turn, be composed of an arbitrary combination of scanning particle beams and flat beams.

The possibilites provided for writing potential information into the measuring points can also be analogously employed for reading potential information from circuit nodes. An arbitrary combination of scanning particle beams and flat beams can also be employed for reading potential information from the so-called "second circuit nodes" set forth herein. Since a scanning particle beam can be guided particularly simply and quickly in one dimension, two particle probes disposed perpendicular to one another can be advantageously employed for reading potential information from circuit nodes that are disposed in a two-dimensional surface. These two reading probes are conducted parallel to the two-dimensional surface in which the circuit nodes to be checked are disposed. These two reading probes thereby exhibit a distance from the surface in which the circuit nodes are disposed. This distance is selected such that the reading probes do not contact the circuit nodes when reading potential information from these circuit nodes so that the reading probes can not trigger any secondary electrons at the circuit nodes. On the other hand, the distance between the surface in which the circuit nodes are disposed and the reading probes which proceed parallel to this surface should be so small that the strength of the interaction between the reading probes and the potential of a circuit node is sufficiently high for a good measuring result. These particulars concerning the distance of a reading probe from a circuit node to be inspected apply in general, regardless of the type and plurality of reading probes.

When two reading probes extend parallel to the surface in which the circuit nodes are to be investigated are disposed and perpendicular to one another, then one of the two reading probes can define an x coordinate of the circuit nodes to be investigated and the second of the two reading probes can define a y coordinate of these circuit nodes. In this manner, every circuit node in a two-dimensional surface can be selected with two leading probes in a simple manner. When a reading probe sweeps only a single circuit node which is charged or, respectively, has been charged in a way to be checked, then the potential of this single circuit node can already be quantitatively identified with the assistance of only a single reading probe. When a reading probe crosses a plurality of circuit nodes that are charged or, respectively, have been charged and whose potentials are to be identified, then it is meaningful to select each of these individual circuit nodes in such a fashion with two reading probes disposed perpendicular to one another that each of the circuit nodes is respectively disposed adjacent the intersection of the two reading probes in an individual measurement. By comparison to the test results that have been achieved with a faultless test subject (golden device), a determination can then be made whether the potential at a circuit node corresponds to a faultless behavior of a unit under test.

When a plurality of circuit nodes that are charged or, respectively, have been charged and whose potentials are to be checked lying close proximity to one another, then additional information concerning the behavior of a system of conductive connections between various circuit nodes can be obtained by variation of the primary energies of the reading probes and by comparison to the test results that had been acquired from a faultless test subject. The lower the primary electron energies of such a reading beam, all the more greatly are the particles of such a reading beam deflected in the proximity of a charge of the same kind. Given a low primary beam energy of a reading probe, the particles therefore sense only the potential of a single charged circuit node, whereas the particles given high primary beam energies can entrain so much energy that, despite deflection at a plurality of charged circuit nodes, they can still provide information via the point of incidence on a location-sensitive detector as to whether they have been more-or-less deflected at a circuit node. The potential of a circuit node can therefore be identified by combining the measured results of two or more reading probes which respectively intersect over a circuit node in arbitrary combinations and which need not necessarily be disposed perpendicular to one another.

BRIEF DESCRIPTION OF THE DRAWINGS

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
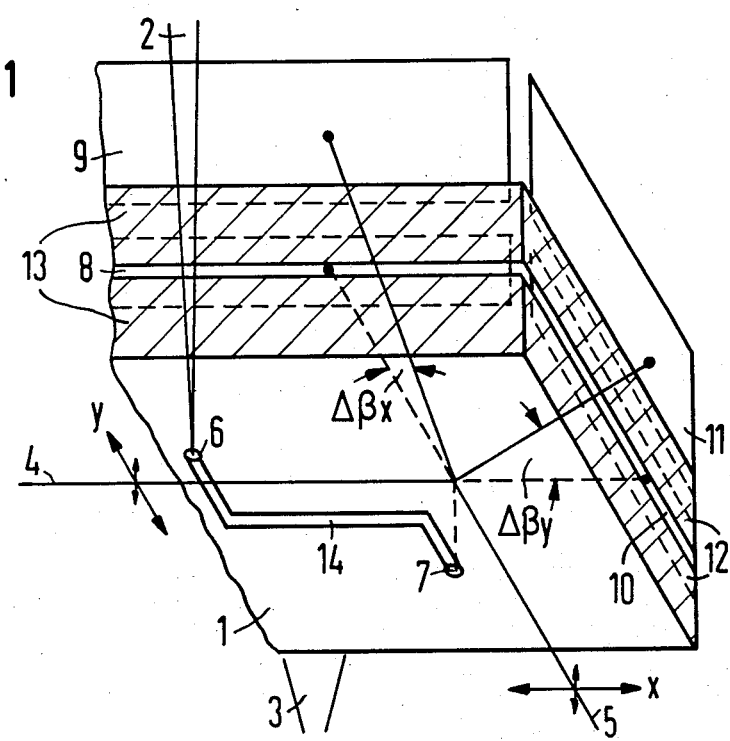
FIG. 1 is a schematic illustration of apparatus for electrical testing of microwired structures having separate writing probes and reading probes in accordance with the present invention.

FIG. 1 illustrates an apparatus for testing a microwired structure 1. A circuit node 6 within the microwired structure 1 is charged to a defined potential with the assistance of a scanning electron beam 2 which functions as a writing probe. The electrical charging of the circuit node 6 with the assistance of a writing probe 2 can occur in a manner as disclosed in the two aforementioned U.S. patents. When the electrical connection 14 between the first circuit node 6 and a second circuit node 7 is electrically conductive, charge from the circuit node 6 is transported via the electrical connection 14 to the circuit node 7 during the charging event at the circuit node 6. The advantage of the invention over the art heretofore known is provided in that a secondary electron current need not be generated at the second circuit node 7 with the assistance of a second electron probe. Generating a secondary electron current, in particular, introduces additional measuring uncertainty. Given an apparatus according to the illustrative embodiment of FIG.1, two reading probes 4, 5 extending parallel to the surface of the microwire structure 1 and at a distance from this surface of the microwire structure 1 are conducted perpendicular to one another such that they both extend above the second circuit node 7. The two reading probes 4, 5, of course, should not intersect immediately simultaneously above the second circuit node 7, since they would otherwise additionally influence one another in an uncontrollable manner due to their charged particles. The reading probes 4, 5 can therefore be conducted above the second circuit node 7 at the same distance in chronological succession or can also have respectively different spacings from the surface of the microwired structure 1. When the circuit node 7 is not charged, then the reading probe 5 is not deflected above the circuit node 7 and can be documented in a detector 8. When the circuit node 7 is charged, then the reading probe 5 is deflected above the circuit node 7 due to electrical repulsion and can be documented in a detector 9. In order to increase the documentation reliability, the detectors 8 and 9 can be separated from one another by shields 13.

When the circuit node 7 is not charged, the reading probe 4 is not deflected and can be documented in a detector 10. When the circuit node 7 is charged, the reading probe 4 is deflected above the circuit node 7 due to electrical repulsion and can be documented in a detector 11. For documentation protection, the two detectors 10, 11 can again be separated by a shield 12.

The reading probe 5 can be shifted back and forth in the x direction parallel to the surface of the microwired structure 1. The reading probe 4 can be shifted back and forth in the y direction, likewise parallel to the surface of the microwired structure 1. The geometrical point of intersection of the reading probes 4 and 5 respectively defines the coordinates $x_i$, $y_j$ of a circuit node 7 under test in this manner. The reading probes 4, 5 can also be dislocated in a direction perpendicular to the surface of the microwired structure 1. For example, it can thereby be achieved that at least one of the two reading probes 4, 5 directly impinges on the circuit node 7 and can trigger a secondary beam emission at the circuit node 7 given a suitable primary beam energy and thereby erase a charge present at the circuit node 7.

So-called line-shaped gas-concentrated electron beams are illustrated in FIG. 1 as the reading probes 4 and 5. Flat beams can, however, also be employed. For example, such a flat beam can be used instead of the reading probe 5. Such a flat beam can simultaneously sweep the entire surface of the microwired structure 1 or a portion thereof at a defined distance from the microwired structure 1. When the detectors 8 and 9 in the x direction illustrated in FIG. 1 are location sensitive, it can be documented at which coordinate at least one circuit node is charged.

A flat or fan beam 3 can also be employed for writing potential information into first circuit nodes 6 which, for example, are located on the underside of the microwired structure 1. Such a beam 3 is described in greater detail in, for example, the aforementioned U.S. patents.

The primary beam energies of the reading probes 4 and 5 need not necessarily be of the same magnitude. When the primary beam energies of the reading probes 4 and 5 are different, then the deflection angles $\Delta\beta_x$ and $\Delta\beta_y$ are also different from one another. When, for example, the detector 9 is also location sensitive in that direction that is perpendicular to the surface of the microwired structure 1, a discrimination can be made as to whether the reading probe 5 has been deflected by electrical repulsion at one or a plurality of circuit nodes.

The reading probes 4 and 5 need not necessarily be conducted parallel to the surface of the microwired structure 1. What is important is that the reading probes 4 and 5 do not trigger any secondary electrons when reading potential information and that, on the other hand, their interaction with the electrical fields on the surface of the microwired structure 1 is sufficient to be able to make a statement concerning the size of the potential.

Figure 2:
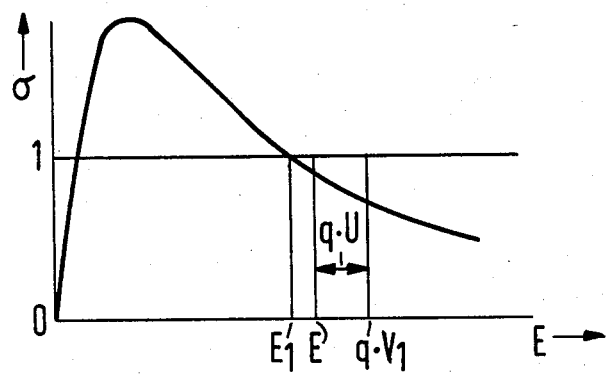
FIG. 2 is a graphic illustration showing the charging of a circuit node.

FIG. 2 explains the operation of charging a second circuit node 7 via the charging of a first circuit node 6. In order to be able to explain the charging of a first circuit node 6 with the assistance of a writing probe 2, a few points must be made with respect to secondary electron emission of solid bodies when irradiated with charged particles. The physical effect of secondary electron emission is well known to the person of ordinary skill in the field of electron beam mensuration technology. Details concerning secondary electron emission are specified, for example, in the aforementioned U.S. Pat. No. 4,415,851. Further information regarding secondary electron emission has been published as "Secondary Electron Emission of Solid Bodies upon Irradiation with Electrons" in the publication of R. Kollath in the Handbook "Handbuch der Physik", (S.Flügge, editor), Vol. 21, 1956, pp. 232-303.

Upon irradiation of a first circuit node 6 with the assistance of a writing probe 2, both backscatter electrons and secondary electrons are emitted by the circuit node 6. Given low primary beam energies of the writing probe 2, a distinction cannot be made between secondary electrons and backscatter electrons in the case of electrons emerging from the region of the circuit node 6. For primary beam energies of about 1 keV-5 keV (given perpendicular incidence of the primary beam), all electrons emerging from the region of the circuit node 6 are therefore considered to be secondary electrons. What is meant by electron yield is the number of secondary electrons and backscatter electrons released in the region of the circuit node 6 per primary electron beam.

FIG. 2 illustrates the electron yield $\sigma$ as a function of the energy E. The primary electrons of the writing beam 2 land on the surface of the circuit node 6 with the "landing" energy E when the voltage of the beam generator of the writing beam 2 amounts to the value $V_1$ and when these primary electrons are decelerated at the circuit node 6 by a countervoltage U. If the circuit node 6 were electrically isolated, the "landing" energy E of the primary electrons would have to have the value $E_1$ for the electron yield $\sigma$ to have the value 1. When the electron yield $\sigma$ has the value 1, exactly as many electrons depart from the circuit node 6 as backscatter electrons or as secondary electrons as primary electrons impinge at the circuit node 6. When the electron yield $\sigma$ has the value 1, the potential of the circuit node is not changed by way of the writing probe 2. In order for the circuit node 6 to be negatively charged, the electron yield $\sigma$ must be less than 1. Then, more primary electrons remain in the circuit node 6 than secondary electrons and backscatter electrons emerge from the circuit node 6.

When the circuit node 6 is connected electrically conductive to a second circuit node 7 and when a value of resistance R and a capacitance C can be assigned to the electrical connection 14 between the two circuit nodes 6 and 7, electrical charge can flow from the circuit node 6 to the circuit node 7, namely until a condition of equilibrium has been established between the charging of the circuit node 6 via the writing probe 2 and the charge transport to the circuit node 7 via the electrical connection 14. In order to obtain a stable equilibrium, the "landing" energy E of the primary electrons (in the described example, wherein the circuit node 6 is to be negatively charged) must be greater than $E_1$ and less a voltage V of the primary beam generator of the writing probe 2 multiplied by the elementary charge q.

Since, before execution of a measurement, all circuit nodes of a microwired structure 1 are generally placed at ground potential and since a second circuit node 7 is generally connected to a fixed potential via a further resistance, this fixed potential being capable of being generated, for example, by a writing beam 3, the "landing" energy E at the circuit node 6 will also have a value in the condition of equilibrium that is also greater than the electron energy $E_1$ and less than the voltage $V_1$ of the beam generator of the writing probe 2 multiplied by the elementary charge q. When the structure comprised of the two circuit nodes 6 and 7 and the electrical connection 14 is electrically isolated, the "Landing" energy E at the circuit node 6 will generally be equal to the electron energy $E_1$ in the condition of equilibrium.

When, on the way into the condition equilibrium, the voltage at the circuit nodes 7 is repeatedly measured in succession, then the measurements can be quantitatively evaluated. The following equation thereby applies by approximation:

$$[C \cdot 1 + R \; i_p \alpha q] = \pi/(2 \; \ln 2L/d) \cdot (V_1 - E_1/q)/V_2) \cdot (i_p \alpha q) \cdot (\Delta t/\Delta \beta)$$

where:
C = capacitance that can be assigned to the interconnect 14;
R = value of resistance that can be assigned to the interconnect 14;
$i_p$ = primary electron current of the writing probe 2;
$\beta$ = value of the mathematical derivation of the electron yield as a function of the "landing" energy E when the function of the electron yield $\sigma$ is differentiated according to the "landing" energy E and when the value $E_1$ is inserted for the "landing" energy E after the differentiation;
$\Delta\beta$ = deflection angle of the reading probe 4 or of the reading probe 5;
$\Delta t$ = measuring time belonging to the deflection angle $\Delta\beta$;
q = elementary charge;
d = diameter of the interconnect 14;
L = length of the interconnect 14;
$V_1$ = voltage of the beam generator of the writing probe 2; and
$V_2$ = voltage of the beam generator of a reading probe 4, 5.

A respective deflection angle $\Delta\beta$ is obtained for each reading probe dependent on the respective measuring time $\Delta t$. For example, two equations for the two unknowns R, C can be obtained in this manner. Accordingly, values of resistance R in the range from $10^9$–$10^{13}\Omega$ and capacitances -9--10-17 Farads can be differentiated for in the range of $10^{-9}$–$10^{-17}$ Farads can be differentiated for, for example, tin or copper.

The above-specified equation for the determination of R, C applies by approximation. The best measured results are obtained when the voltage $V_1$ of the beam generator of the writing probe 2, 3 is only slightly higher than that voltage corresponding to the quotient $E_1/q$.

After a measurement has been carried out, the potential at the circuit node 7 can be erased with the assistance of a reading probe 4, 5. To this end, the reading probe 4, 5 is directly applied to the circuit node 7. The energy of the reading probe 5 is thereby selected such that the electron yield $\sigma$ at the circuit node 7 is greater than 1 in this case.

In the illustrative embodiment, the voltage $V_2$ of the beam generator of a reading probe 4, 5 should be slightly lower than the quotient $E_1/q$. Given perpendicular incidence of a writing probe 2, 3, the value $E_1$ lies on the order of 3-4 keV and is shifted towards higher values given oblique incidence of a probe 2, 3, 4, 5 because the electron yield increases given oblique incidence.

Given a suitable voltage $V_1$, the circuit nodes 6, 7 can also be positively charged. A reading probe would then have to consist of positively charged particles (ions).

Semiconductor arrays which are well known in mensuration technology can be employed as the detectors 8, 9, 10, 11. Fiber bundles that are coupled to a light-conducting rod can also be employed as the detectors 8, 9, 10 and 11. A video camera, finally, can be optically coupled to this light-conducting rod. Such a system comprised of fiber bundle, light-conducting rod and video camera then forms a location-sensitive detector just like, for example, an aforementioned semiconductor array detector. That optical fiber that has been impinged by a reading probe 4, 5 can be identified with the video camera via detection of a bright spot as a function of the location. What is important is that a reading probe 4, 5 trigger sufficient signal intensity when impinging a detector 8, 9, 10, 11. Light conductors can therefore comprise a device for intensifying the light intensity at that end at which the radiation to be detected is suppose to impinge, this device being, for example, a film of material having great luminescence, for example a plastic scintillator. A device for signal amplification can also be additionally disposed between the light-conducting rod and the video camera. A further possibility for fashioning the detectors 8, 9, 10, 11 is the use of luminescent diodes, whereof one or more diodes can be provided for each individual detector.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method of testing microwired structures to determine if there is electrical continuity between first and second circuit nodes, comprising the steps of:
    applying a first particle beam to the first node to charge the node and create an electric field at the second node when there is continuity between the two nodes;
    directing a second particle beam past the second node resulting in deflection of the second particle beam in response to the presence of an electric field at the second node; and
    detecting the deflection of the second particle beam as a measure of the voltage at the second node.

2. The method of claim 1, and further comprising the steps of:
    applying individual known potentials to the second node;
    directing the second particle beam past the second node for each of the known potentials; and
    detecting the amount of deflection of the second particle beam for each known potential as a calibration of the test.

3. The method of claim 1, and further defined by the steps of:
    directing the second particle beam past the second node at least twice in succession during charging of the first node; and
    detecting the resulting deflections as a measure of the resistance and capacitance of the electrical connection between the first and second nodes.

4. The method of claim 1, wherein:
    the step of directing a second particle beam is further defined as directing a pair of second particle beams at respective coordinate directions past the second node; and
    the step of detecting deflection of the second particle beam is further defined as detecting the deflection of each beam of the pair of beams with respect to its coordinate direction.

5. The method of claim 4, wherein the step of directing the pair of particle beams past the second node is further defined as:
    directing the pair of second particle beams parallel to the surface of the microwired structure.

6. The method of claim 4, wherein the step of directing the pair of second particle beams is further defined as:
    directing the second particle beams one at a time parallel to and at the same spacing from the microwired structure.

7. The method of claim 4, wherein the step of directing the pair of second particle beams is further defined as:
    directing the pair of second particle beams simultaneously parallel to and at different distances from the microwired structure.

8. The method of claim 1, and further comprising the step of:
    applying the second particle beam to the second node to erase the charge thereon.

9. The method of claim 1, and further comprising the step of:
    generating a gas-concentrated electron beam as at least one of the particle beams.

10. The method of claim 1, and further comprising the step of:
    generating a flat beam as the first particle beam.

11. The method of claim 1, wherein the step of detecting is further defined as:
    detecting the location of beam incidence along a line spaced from the second node.

12. Apparatus for testing a microwired structure for electrical continuity between first and second circuit nodes, comprising:
    a first particle probe generator for generating and directing a first particle probe onto the first circuit node to charge the node to a predetermined potential and to charge the second circuit node when continuity exists;
    a second particle probe generator for generating and directing a second particle probe to a point over and spaced from the second circuit node, the second particle probe being deflected by an electric field of the second circuit node when the same is charged; and
    detection means for detecting the second particle probe and measuring any deflection as representing the potential on the second circuit node.

13. The apparatus of claim 12, wherein:
    said second particle probe generator is a flat beam generator for scanning a plurality of second circuit nodes at the same time; and
    said detection means comprises a location-sensitive detector for detecting and measuring beam deflection for each of the second circuit nodes.

14. The apparatus of claim 12, and further comprising:
    a third particle probe generator for generating and directing a third particle probe towards the point over the second circuit node along a path orthogonal to the path of the second particle probe; and
    wherein said detection means comprises first and second detectors for respectively detecting deflection of the second and third particle probes.

* * * * *